United States Patent [19]

Hijikata et al.

[11] Patent Number: 5,254,214
[45] Date of Patent: Oct. 19, 1993

[54] PLASMA TAPER ETCHING FOR SEMICONDUCTOR DEVICE FABRICATION

[75] Inventors: Isamu Hijikata; Kazutoshi Fujisawa, both of Kanagawa, Japan

[73] Assignee: Tokyo Ohka Kogyo Co., Ltd., Japan

[21] Appl. No.: 764,428

[22] Filed: Sep. 23, 1991

[30] Foreign Application Priority Data

Sep. 21, 1990 [JP] Japan ................................. 2-253631

[51] Int. Cl.$^5$ ................ H01L 21/306; B44C 1/22; C03C 15/00; C23F 1/00
[52] U.S. Cl. .................................. 156/643; 156/345; 156/656; 156/657; 156/659.1
[58] Field of Search ............ 156/643, 656, 657, 659.1, 156/662, 345; 204/192.32, 192.37, 298.31, 298.33, 298.35, 298.38

[56] References Cited

U.S. PATENT DOCUMENTS 4,952,274 8/1990 Abraham ............................ 156/657

OTHER PUBLICATIONS

Collected 8-page (pp. 375-380) Papers of "Lectures in The Symposium of Semiconductors/Integrated Circuits Techniques", published on May 20, 1979 by The Electrochemical Society of Japan, Electronic Materials Committee.
Japanese Patent Kokai (Laid-Open) Publication No. 63-260030, published on Oct. 27, 1988.

*Primary Examiner*—William A. Powell
*Attorney, Agent, or Firm*—Merchant Gould Smith Edell Welter & Schmidt

[57] ABSTRACT

A plasma processing apparatus has a chamber which houses therein a plasma processing region and a plasma generating region spaced therefrom. An object such as a semiconductor wafer, which has surface irregularities including lands, is placed in the plasma processing region. When a plasma is generated in the plasma generating region with a processing gas composed mainly of an argon gas being introduced into the chamber, the corner edges of the lands of the object are etched into a taper shape, and the material etched away from the object is deposited between the lands.

13 Claims, 3 Drawing Sheets

PLASMA TAPER ETCHING FOR SEMICONDUCTOR DEVICE FABRICATION

BACKGROUND OF THE INVENTION

1. Field of the Invention

The present invention relates to a method of and an apparatus for etching, into a tapered shape, corner edges of lands of an oxide film on a wafer surface in the process of semiconductor device fabrication.

2. Description of the Prior Art

For the fabrication of semiconductor devices such as LSI chips, as shown in FIG. 6 of the accompanying drawings, conductors 101 are formed on a semiconductor substrate 100 by photolithography and dry etching, and then an oxide film 102 of $SiO_2$ or the like is deposited on the substrate 100 and the conductors 101 by chemical vapor deposition (CVD). Thereafter, a thin insulating or metal film 103 is deposited on the oxide film 102 by CVD.

Semiconductor devices are fabricated through deposition and removal of metal films, oxide films, and other layers. If a lower layer has surface irregularities when an upper layer is to be deposited on the lower layer, i.e., if the conductors 101 have sharp corner edges and the oxide film 102 has lands 102a and recesses 102b, then the lands 102a over the conductors 101 are rounded, and the thin film 103 deposited on the oxide film 102 tends to become irregular in thickness, i.e., become round and thicker around the corner edges of the conductors 101. When another upper layer is deposited on the thin film 103, the thickness of the additional upper layer is liable to be irregular, or as shown in FIG. 6a, the upper layer, denoted at 103a, may not enter the recesses of the oxide film 103, forming voids V. Depending on the conditions in which the thin film 103 is deposited on the oxide film 102, as shown in FIG. 6b, the thin film 103 may possibly form large round convexities over the lands of the oxide film 102, and adjacent large round convexities may laterally contact each other, leaving a void V therebelow.

SUMMARY OF THE INVENTION

In view of the aforesaid drawbacks of the conventional semiconductor device fabrication process, it is an object of the present invention to provide a method of and an apparatus for etching, into a tapered tape, corner edges of lands of a deposited film, so that a thin insulating or metal film to be subsequently deposited on the film will have a uniform thickness, and for depositing the removed material, which is etched away from the corner edges, between adjacent lands or onto the bottoms of recesses.

According to the present invention, there is provided a method of etching an object with surface irregularities including lands in a plasma, comprising the steps of preparing plasma processing means having a chamber which houses therein a plasma processing region and a plasma generating region spaced therefrom, placing the object to be etched in the plasma processing regions and etching the corner edges of the lands of the object into a taper shape in a plasma generated in the plasma generating region with a processing gas introduced therein.

According to the present invention, there is also provided an apparatus for etching, into a taper shape, the corner edges of lands of surface irregularities on a surface of an object, comprising chamber means having a chamber which houses therein a plasma processing region and a plasma generating region spaced therefrom, means for introducing a processing gas, mainly composed of argon, into the chamber means, and means for applying high-frequency electric power to the chamber means to generate a plasma with the processing gas within the plasma generating region, the arrangement being such that the object is placed in the plasma processing region with the surface irregularities of the object being disposed in confronting relation to the plasma generating region, whereby the corner edges of the lands can be etched into a taper shape.

The above and further objects, details and advantages of the present invention will become apparent from the following detailed description of preferred embodiments thereof, when read in conjunction with the accompanying drawings.

DETAILED DESCRIPTION OF THE PREFERRED EMBODIMENTS

Figure 1:
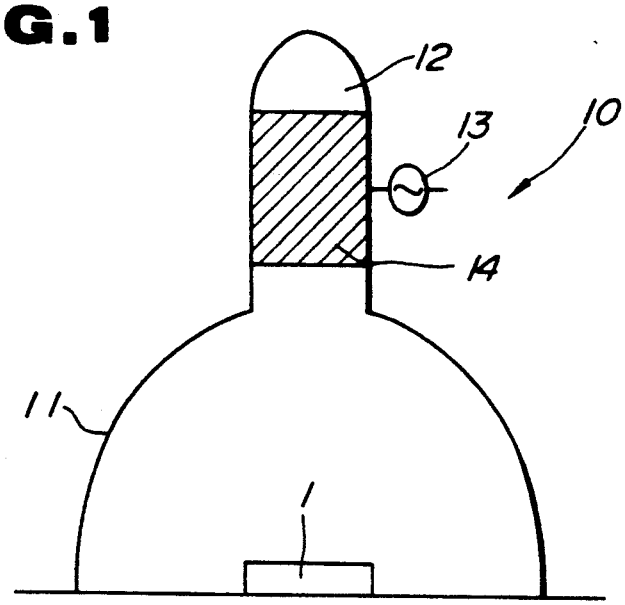
FIG. 1 is a schematic view of a plasma processing apparatus used to carry out a plasma taper etching method according to the present invention.
Figure 6:
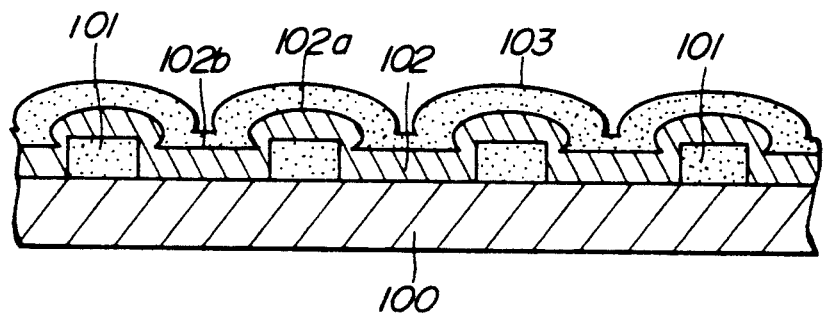
FIG. 6 is an enlarged fragmentary cross-sectional view of a semiconductor device fabricated according to a conventional method.
Figure 6A:
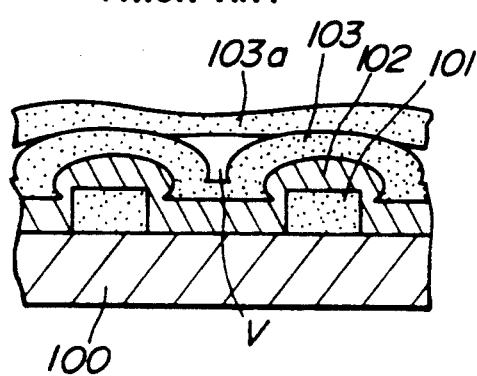
FIG. 6a is an enlarged fragmentary cross-sectional view of another semiconductor device fabricated according to the conventional method.
Figure 6B:
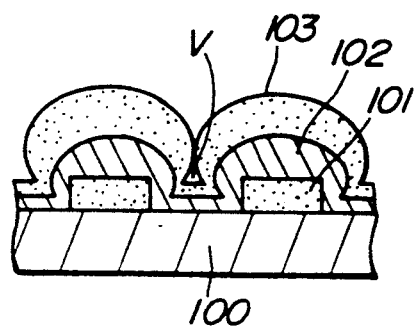
FIG. 6b is an enlarged fragmentary cross-sectional view of still another semiconductor device fabricated according to the conventional method.

A plasma taper etching method according to the present invention will be described below with reference to FIGS. 2(A) through 2(C).

As shown in FIG. 2(A), conductors 2 are formed on a semiconductor substrate 1 by photolithography and dry etching, and then an oxide layer 3 Of $SiO_2$ or the like is deposited on the substrate I and the conductors 2 by chemical vapor deposition (CVD). The oxide layer 3 has lands 3a and recesses 3b as shown in FIG. 2(B).

Then, the semiconductor substrate 1 with the deposited films is placed in a plasma processing apparatus 10 shown in FIG, I for a further etching process. The plasma processing apparatus 10 comprises a bell-jar chamber 11 of quartz or the like and a hollow cylinder 12 projecting upwardly from the center of the upper end of the chamber 11. The cylinder 12 is surrounded by an electrode 14 electrically connected to a high-frequency generator 13. The inner space of the cylinder 12 that is surrounded by the electrode 14 serves as a plasma generating region, with a plasma processing region being defined therebelow in the chamber 11. The semiconductor substrate I on which the oxide layer 3 with the lands 3a and the recesses 3b is deposited is placed in the plasma processing region.

Then, the oxide layer 3 is etched in the plasma processing region under the following conditions:

Processing gas: Ar or Ar+O$_2$
Pressure: 0.01 Torr through 0.2 Torr
Temperature: 50° C. through 150° C.
Electric power applied: 500 W through 2,000 W.

Figure 2:
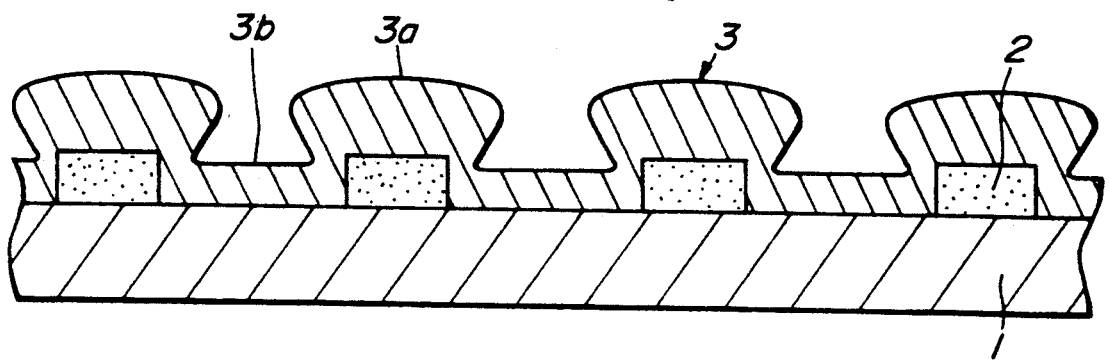
FIGS. 2(A) through 2(C) are enlarged fragmentary cross-sectional views of a semiconductor device as it is fabricated through successive steps of the method according to the present invention.
Figure 2:
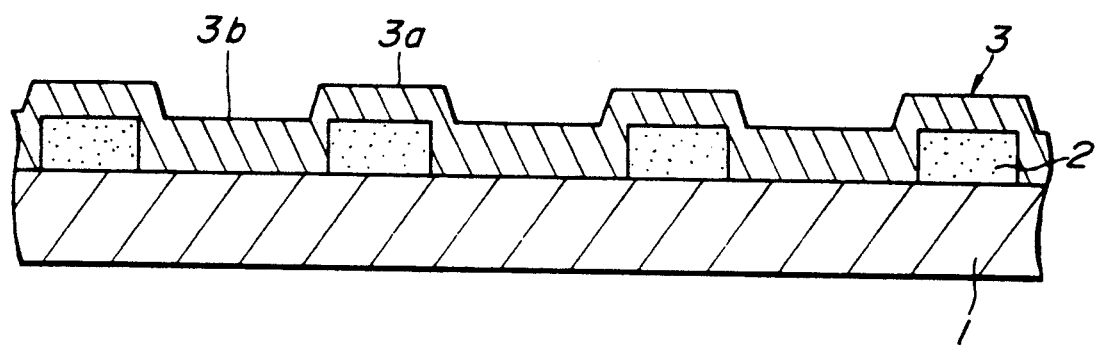
Figure 2:
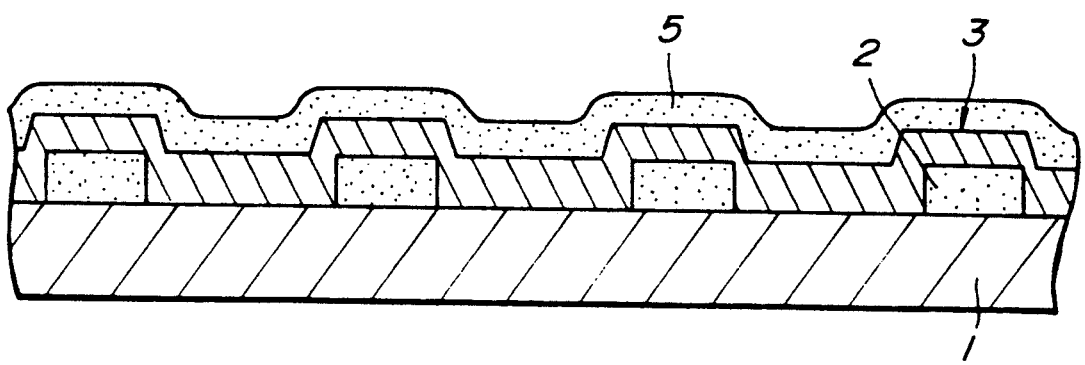

When the oxide layer 3 is processed under the above conditions, a plasma is generated, and activated Ar ions strike the surface of the oxide layer 3. Since the corner edges of the lands 3a are etched at a highest etch rate, the material is removed from the corner edges at a maximum rate, and hence they are etched into a taper shape at opposite sides of the lands 3a or opposite walls of the recesses 3b though other regions of the lands 3a are also etched, as shown in FIG. 2 (B), Furthermore, when the oxide layer 3 is etched, the material thereof is removed and deposited on sides of the lands 3a or the bottoms of the recesses 3b. If fine patterns are etched, then the recesses between the patterns are filled with the deposited material that has been etched away from the oxide layer 3. Therefore, when a thin oxide film or the like is subsequently deposited on the surface formed thus far, voids (gaps) are prevented from being developed between the patterns, and the patterns are more flattened as a whole. This is a unique feature of the present invention, and has not been experienced with a taper etching process using an argon gas in the conventional etching apparatus.

Thereafter, an insulating or metal film 5 is uniformly deposited on the surface of the oxide layer 3 by CVD or the like, as shown in FIG. 2(C).

Specific Examples of the present invention will be described below:

Example 1

A silicon wafer had conductors in the form of aluminum patterns which are 0.7 μm wide and 0.8 μm spaced from each others with a silicon oxide layer being deposited on the conductors by CVD. The silicon wafer was placed in a plasma processing apparatus TCA-2400 (manufactured by Tokyo Ohka Kogyo CQ,, Ltd.) which has a plasma generating region and a plasma processing region that are spaced or separated from each other, with the plasma processing region being positioned below the plasma generating region. The silicon oxide layer was etched in the plasma processing region with an argon gas under a pressure of 0.1 Torr at a temperature of 50° C. with applied electric energy of 500 W for 2 minutes. As a result, the corner edges of the lands of the silicon oxide layer were etched into a taper shape. The recesses between the adjacent patterns or the bottoms of the recesses are filled with the material removed from the silicon oxide layer by the etching process. The flatness of the silicon oxide layer was improved.

Example 2

The same silicon oxide layer as that in Example 1 was etched under the same conditions except at a temperature of 110° C. with applied electric energy of 800 W. The corner edges of the lands of the silicon oxide layer were etched well, and the flatness of the silicon oxide layer was improved, as with Example 1.

Example 3

The same silicon oxide layer as that in Example 1 was etched under the same conditions except under a pressure of 0.05 Torr at a temperature of 100° C. with applied electric energy of 800 W. The corner edges of the lands of the silicon oxide layer were etched well, and the flatness of the silicon oxide layer was improved, as with Example 1.

Three specific structures of the plasma processing apparatus 10 shown in FIG. 1 will be described below with reference to FIGS. 3 through 5.

Figure 3:
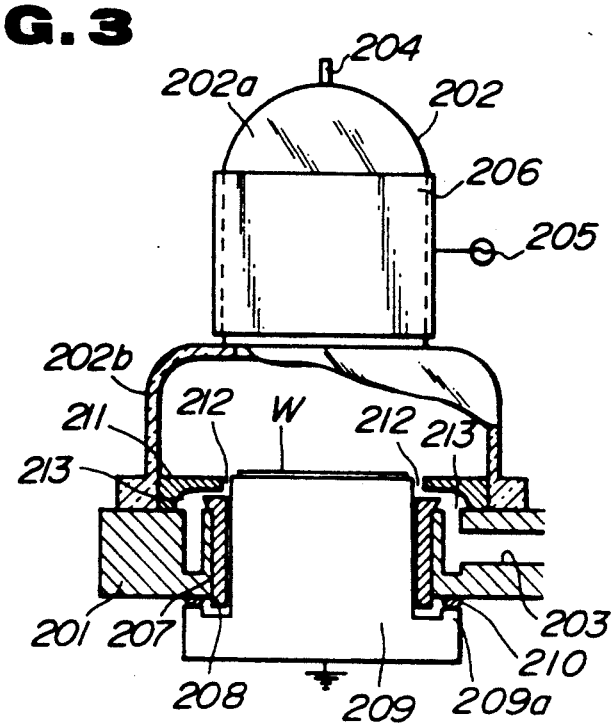
FIG. 3 is an elevational view, partly broken away, of a specific plasma processing apparatus according to an embodiment of the present invention.
Figure 4:
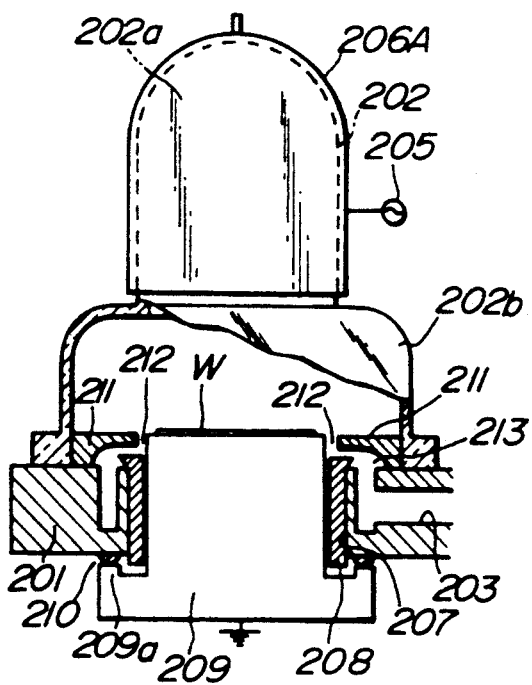
FIG. 4 is an elevational view, partly broken away, of a specific plasma processing apparatus according to another embodiment of the present invention.

A plasma processing apparatus shown in FIG. 3 has a bell-jar chamber 202 of quartz fixedly mounted on a bottom plate 201 with a discharge passage 203 defined therein. The quartz chamber 202 has a smaller-diameter upper portion 202a and a larger-diameter lower portion 202b. To the top of the smaller-diameter portion 202a, there is connected a tube 204 for introducing a reactive gas into the chamber 202, An upper tubular electrode 206 electrically connected to a high-frequency power supply 205 is disposed circumferentially around the smaller-diameter portion 202a. The bottom plate 201 has a central opening 212 defined therein at the center of the chamber 202.

A lower table-shaped electrode 209 is vertically movably disposed within a tubular collar 208 that is placed in the central opening 207. The lower electrode 209 is grounded, and has a radially outwardly extending flange 209a. When the lower electrode 209 is elevated, the upper end of the flange 209a is pressed against an annular seal 210 attached to a lower surface of the bottom plate 201 for thereby hermetically sealing the interior space of the chamber 202. A discharge ring 211 is mounted on the upper surface of the bottom plate 201 within the chamber 202. The discharge ring 211 has an outer circumferential surface held against an inner circumferential surface of the chamber 202, and an upper surface lying flush with the upper surface of the lower electrode 209. The discharge ring 211 has an inside diameter greater than the outside diameter of the lower electrode 209, thereby defining a discharge port 212 around the lower electrode 209 for evacuating the chamber 202. The discharge pot 212 communicates with the discharge passage 203 in the bottom plate 201 through a discharge passageway 213 that is defined between the discharge ring 211, the collar 208, and the bottom plate 201.

The upper electrode 206 may be disposed within chamber 202. The discharge port 212 defined around the lower electrode 209 may be replaced with a plurality of holes defined at equal intervals around the lower electrode 209. If a semiconductor wafer W to be processed is much smaller than the lower electrode 209, the discharge ring 211 and the lower electrode 209 may not lie flush with each other, and the discharge ring 211 may be of such a dimension to extend to the outer circumference of the wafer W, so that the chamber 202 may be evacuated through the gap between the discharge ring 211 and the lower electrode 209, i.e., through the discharge port 212 and the discharge passageway 213.

To etch the surface of the semiconductor wafer W in the plasma within the chamber 202, the lower electrode 209 is first lowered from the position shown in FIG. 3, and then the wafer W is placed on the upper surface of the lower electrode 209. Then, the lower electrode 209 is lifted until the interior space of the chamber 202 is hermetically sealed. Then, the chamber 202 is evacuated through the discharge port 212 to develop a vacuum in the chamber 202. At the same time, an argon gas or the like is introduced into the chamber 202 through the tube 204. High-frequency electric energy is applied to the upper electrode 206 to generate a plasma in the plasma generating region in the smaller-diameter portion 202a of the chamber 202. The wafer W is now etched in the plasma within the plasma processing region.

According to the present invention, as described above, an object with surface irregularities, e.g., a wafer, is etched in the plasma processing apparatus in which the plasma generating region and the plasma processing region are separated from each other, and the gas used to etch the object therein is mainly composed of argon. The corner edges of the lands, or the side walls of the recesses, of the object are etched into a taper shape, and the material etched away from the object is deposited between the lands or on the bottoms of the recesses. Therefore, when a thin film is further deposited on the etched object by CVD or the like, the deposited thin film has an increased degree of flatness. Since the object to be etched is placed in the plasma processing region spaced from the plasma generating region in the plasma processing apparatus, unwanted damage to the object can be reduced unlike a physical etching process, such as reactive ion etching (RIE), in which a bias voltage is applied to the object. When the processing gas is discharged from a region immediately adjoining the circumference of the wafer W, the etching process and the material deposition are promoted, FIG. 4 shows another plasma processing apparatus which differs from the plasma processing apparatus shown in FIG. 3 in that a cap-shaped upper tubular electrode 206 cover the entire smaller-diameter portion 202a of the chamber 202.

Figure 5:
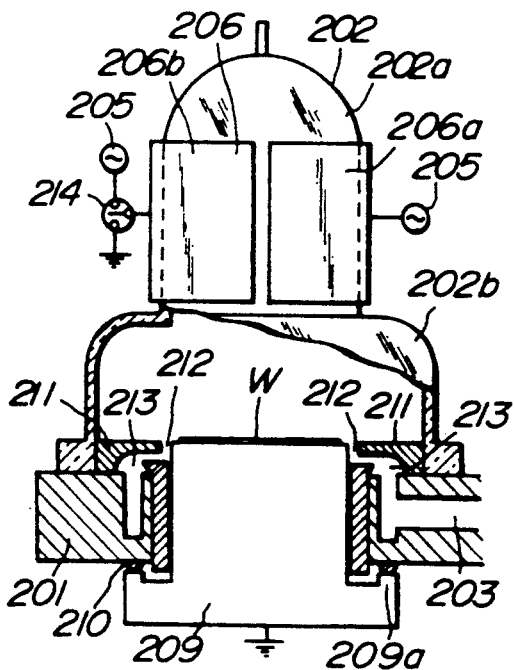
FIG. 5 is an elevational view, partly broken away, of a specific plasma processing apparatus according to still another embodiment of the present invention.

FIG. 5 illustrates still another plasma processing apparatus which is similar to the plasma processing apparatus shown in FIG. 3 except that an upper tubular electrode 206 comprises two separate semicylindrical electrodes 206a, 206b. Only the electrode 206a is electrically connected directly to the high-frequency electrode 205, and the other electrode 206b is selectively connectable to the high-frequency power supply 205 and ground through a switch 214.

Although there have been described what are at present considered to be the preferred embodiments of the invention, it will be understood that the invention may be embodied in other specific forms without departing from the essential characteristics thereof. The present embodiments are therefore to be considered in all respects as illustrative, and not restrictive. The scope of the invention is indicated by the appended claims rather than by the foregoing description.

We claim:

1. A method of etching an object with surface irregularities including lands in a plasma, comprising the steps of,.
   preparing plasma processing means having a chamber which houses therein a plasma processing region and a plasma generating region spaced therefrom;
   placing the object to be etched in said plasma processing region; and
   etching the corner edges of the lands of the object into a taper shape in a plasma generated in said plasma generating region with a processing gas introduced therein, 2. A method according to claim 1, wherein said etching step includes the step of depositing the material etched away from said object between the lands for flattening the surface of the object.

3. A method according to claim 1, wherein said plasma processing region is positioned downwardly of said plasma generating region, said etching step further including the step of discharging said processing gas from a region immediately adjoining the circumference of said object to promote the etching of said object.

4. A method according to claim 1, wherein said object comprises a silicon wafer and said surface irregularities comprise a silicon oxide layer deposited on aluminum patterns on said silicon wafer, said object being etched under a pressure ranging from 0.01 to 0.2 Torr at a temperature ranging from 50° to 150° C. with applied electric power ranging from 500 to 2000 W.

5. A method according to claim 1, further comprising steps of:
   introducing a processing gas into the chamber; and
   applying high-frequency electric power to the chamber to generate a plasma with the processing gas within the plasma generating region.

6. A method according to claim 5, wherein the processing gas mainly composed of argon.

7. A method according to claim 1, wherein the object is placed in the plasma processing region with the surface irregularities of the object being disposed in confronting relation to the plasma generating region, whereby the corner edges of the lands can be etched into a taper shape.

8. A method according to claim 5, wherein the object is placed on a lower table-shaped electrodes defined by a bottom plate and a vertically movable member, the lower table-shaped electrodes being electrically grounded.

9. A method according to claim 8, wherein the chamber means comprising a bell-jar chamber of quartz having a larger-diameter portion placed on the bottom plate and defining the plasma processing region therein, and a small-diameter portion defining a plasma generating region spaced upwardly from the plasma processing region, with the processing gas being introduced into the smaller-diameter portion, the bottom plate having a central opening for allowing the lower table-shaped electrode to move vertically therein to position the object in the plasma processing region, an upper electrode disposed around the smaller-diameter portion of the chamber applying the high-frequency electric power to the smaller-diameter portion of the chamber.

10. A method according to claim 9, the step of placing the object in the plasma processing region comprising the steps of:
    lowering the lower electrode;
    placing the object on an upper surface of the lower electrode;
    lifting the lower electrode until the chamber is hermetically sealed; and
    evacuating the chamber through a discharge port to develop a vacuum in the chamber.

11. A method according to claim 9, wherein said upper electrode comprises a tubular electrode disposed circumferentially around said smaller-diameter portion of said chamber.

12. A method according to claim 9, wherein said upper electrode comprises a cap-shaped electrode covering said smaller-diameter portion in its entirety.

13. A method according to claim 9, wherein said upper electrode comprises two separate semicylindrical electrodes disposed circumferentially around said smaller-diameter portion of said chamber, one of said semicylindrical electrodes being supplied with the high-frequency electric power by said means for applying high-frequency electric power, the other semicylindrical electrode being selectively connectable to said means for applying high-frequency electric power and ground.

* * * * *